United States Patent [19]

Watanabe et al.

[11] 4,180,804
[45] Dec. 25, 1979

[54] REMOTE CONTROL DEVICE FOR AN AMPLIFIER TRAP CIRCUIT

[75] Inventors: Masakatsu Watanabe, Tokyo; Minoru Nakada, Tokorozawa; Takeshi Takeuchi, Yokohama, all of Japan

[73] Assignee: Hochiki Corporation, Tokyo, Japan

[21] Appl. No.: 912,155

[22] Filed: Jun. 2, 1978

[30] Foreign Application Priority Data

Jun. 2, 1977 [JP] Japan .................. 52-72016[U]

[51] Int. Cl.² .............................................. H04B 1/10
[52] U.S. Cl. ............................. 340/310 R; 340/167 P; 340/176
[58] Field of Search ............. 340/172, 176, 167 P, 340/310 R, 505, 531, 533

[56] References Cited

U.S. PATENT DOCUMENTS 3,201,754  8/1965  Reiner et al. ................ 340/176
3,886,538  5/1975  Takeuchi ................ 340/310 R Primary Examiner—Alvin H. Waring
Attorney, Agent, or Firm—Sughrue, Rothwell, Mion, Zinn, and Macpeak

[57] ABSTRACT

An FM trap circuit in an amplifier mounted on a roof top antenna is made operable from inside the home by providing a switch on the amplifier which is responsive to the negative half cycle in an A.C. power signal to disable the trap circuit and a switch in the home for selectively sending a full cycle A.C. power signal or a half-wave rectified signal to the amplifier.

11 Claims, 13 Drawing Figures

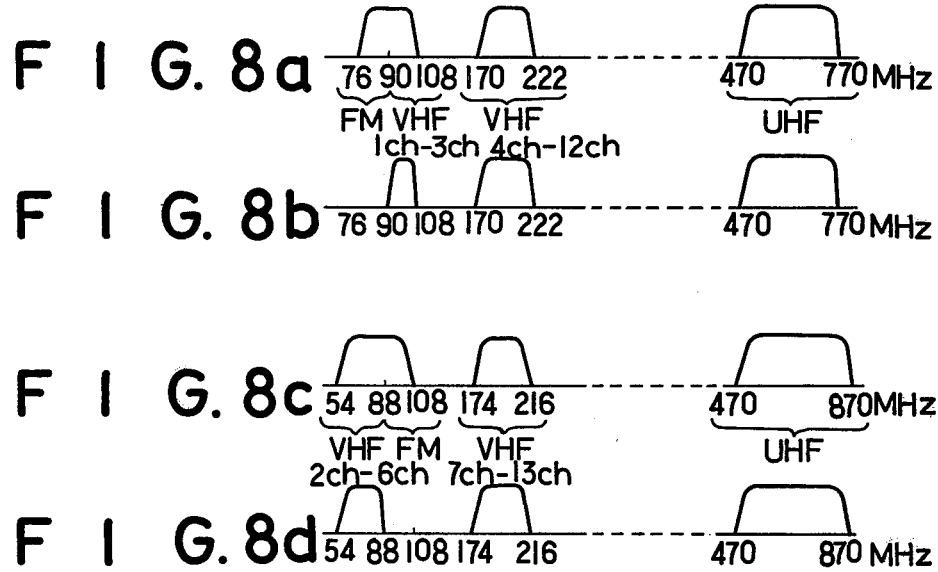
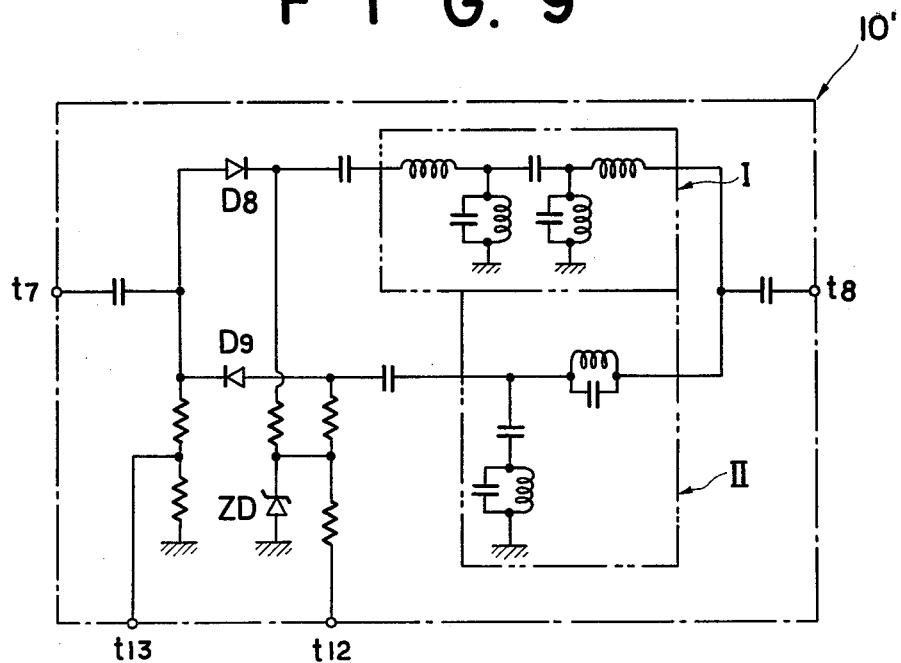

REMOTE CONTROL DEVICE FOR AN AMPLIFIER TRAP CIRCUIT

BACKGROUND OF THE INVENTION

This invention relates to a remote control device for a trap circuit in a television community receiving system.

A TV and FM wave amplifier built in a casing is usually provided immediately below a TV and FM wave receiving antenna of a television community receiving system extensively employed today. The amplifier is provided with an FM trap circuit. In most of the amplifiers, the power necessary for operating the amplifier is supplied thereto through a signal transmitting coaxial cable from a power supply unit provided in the subscriber's house.

Such a conventional community receiving system is shown in FIG. 1, which comprises: a television (TV) wave and FM wave receiving antenna 1; an amplifier 2; a power supply unit 3; a television set 4; and a coaxial cable CX. In this community receiving system, the TV wave and the FM wave received by the antenna 1 are simultaneously amplified by the amplifier 2, and therefore the picture of the television set 4 is adversely affected by the cross modulation and intermodulation caused between the TV wave and the FM wave. In order to eliminate the difficulty, heretofore an FM trap circuit and a slide switch for connecting and disconnecting the trap circuit are provided in the amplifier, so that when it is not intended to receive an FM signal, the slide switch is operated to actuate the FM trap circuit to block the reception of the FM wave, so as not to adversely influence the television picture.

The essential components of the conventional amplifier and power supply unit are shown in FIG. 2, in which reference character $t_1$ designates an input terminal for receiving a reception wave from an antenna (not shown), and reference character $t_2$ designates an output terminal for the reception wave amplified, the output terminal serving also as a power supply input terminal. Between these terminals, a slide switch $SW_0$ for connecting and disconnecting an FM trap circuit 6, an amplifier section 5 and a high-pass capacitor $C_6$ are connected as shown in FIG. 2. The FM trap circuit is designated by reference numeral 6, and may be connected between the input terminal $t_1$ and the amplifier 5 through the slide switch $SW_0$. A choke coil $L_{11}$, a diode $D_2$ with the polarity as indicated and a DC power supply section 7 (including a voltage smoothing circuit and a constant voltage circuit) are connected between the amplifier 5 and a point $P_1$ between the terminal $t_2$ and the capacitor $C_6$. The DC power supply section 7 feeds current to the amplifier 5. These elements surrounded by the one-dot chain $l_1$ form a community receiving amplifier 2, and are built in a casing except for the slide switch $SW_0$ which is provided on the outside of the casing. The amplifier 2 thus formed is provided immediately below the antenna on the roof. Components surrounded by the one-dot chain $l_2$ in FIG. 2 form a power supply unit which is disposed in the subscriber's house or at a position in the vicinity of the house to which the subscriber can readily have access. The power supply unit has terminals $t_3$ and $t_4$. The terminal $t_3$ is connected through a coaxial cable CX to the terminal $t_2$ of the amplifier, and it serves as a terminal for receiving signals from the amplifier and also as a terminal for supplying current to the amplifier. The terminal $t_4$ is to be connected to a television set (not shown). A highpass capacitor $C_7$ is connected between the terminals $t_3$ and $t_4$. A choke coil $L_{10}$ and the secondary coil $L_9$ of a transformer T are connected in series between ground and a point $P_2$ between the terminal $t_3$ and the capacitor $C_7$. The primary coil $L_8$ of the transformer T is connected to the commercial power supply.

In operation, the 100 V commercial AC power supply voltage is dropped to 20–30 volts by means of the transformer, which is applied through the choke coil $L_{10}$ and the coaxial cable CX to the amplifier 2, where it is applied through the choke coil $L_{11}$ to the diode $D_2$, as a result of which it is subjected to half-wave rectification and is then applied to the DC power supply section 7. In the DC power supply section 7, the voltage thus rectified is smoothed and is outputted as a constant voltage to operate the amplifier section 5. Then, an FM wave is selected by operating the slide switch $SW_0$ provided outside the casing.

If in the case of observing a television picture, an FM wave is present, then cross modulation and intermodulation are caused between the FM wave and the TV wave as was described before, which will exert a bad influence on the television picture. Therefore, the slide switch $SW_0$ is switched over to the trap circuit side to insert the FM trap circuit 6 in the signal circuit thereby to block the FM wave and to minimize the effect of the FM wave.

FIGS. 8(a) and 8(c) show the TV and FM wave transmission frequency bands in Japan and in USA, respectively. If the FM trap circuit is operated as described above, the FM wave is blocked as in FIG. 8(b) (in Japan) and in FIG. 8(d) (in USA).

As described above, the amplifier having the FM trap circuit and the slide switch for connecting and disconnecting the FM trap circuit is generally provided on the roof below the antenna. When the FM trap circuit is connected by operating the slide switch, the FM wave cannot be received. Accordingly, if it is required to receive the FM wave, someone has to climb on the roof to operate the slide switch to disconnect the FM trap circuit. This is hazardous and troublesome.

SUMMARY OF THE INVENTION

Accordingly, an object of this invention is to eliminate the above-described difficulty. More specifically, an object of the invention is to remotely control the trap circuit connecting and disconnecting operation by operating the switch of the power supply unit provided indoor, instead of operating the slide switch provided on the amplifier.

This is accomplished according to the present invention by providing an FM trap circuit in the amplifier, a switch for selectively disabling the FM trap circuit and a control means in the home for operating the switch via the power line to the amplifier. The switch is preferably responsive to the negative half cycle of the A.C. power signal to the amplifier and the control means selectively sends a full A.C. power signal or a half-wave rectified power signal to the amplifier.

BRIEF DESCRIPTION OF THE DRAWINGS

This invention will be described with reference to its preferred embodiment shown in the accompanying drawings, in which:

FIG. 8(a) is an explanatory diagram showing the TV and FM transmission frequency bands in Japan.

FIG. 8(b) is an explanatory diagram showing the TV transmission frequency bands where the FM wave is cut off, in Japan.

FIG. 8(c) is an explanatory diagram showing the TV and FM transmission frequency bands in USA.

FIG. 8(d) is an explanatory diagram showing the TV transmission frequency bands where the FM wave is cut off, in USA.

FIG. 9 is a circuit diagram showing a trap circuit for preventing the interference of an adjacent channel.

DETAILED DESCRIPTION OF THE INVENTION

Figure 1:
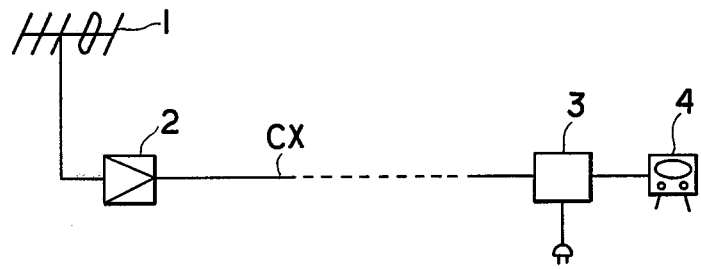
FIG. 1 is a block diagram showing a television community receiving system.
Figure 2:
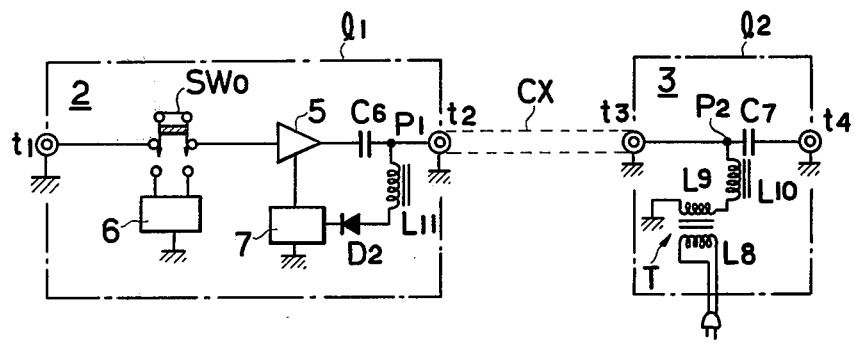
FIG. 2 is a schematic circuit diagram showing a conventional amplifier and a power supply unit.
Figure 3:
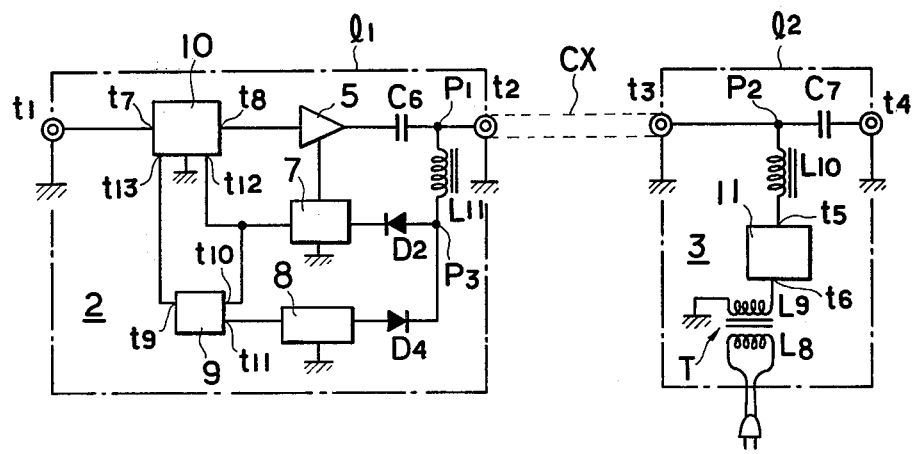
FIG. 3 is a schematic circuit diagram showing an amplifier and a power supply unit according to this invention.
Figure 4:
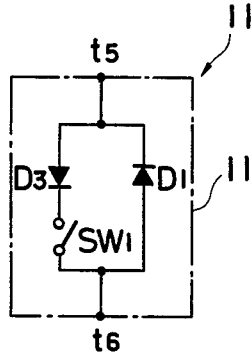
FIG. 4 is a circuit diagram showing a switch operating section.

FIG. 3 is a schematic diagram showing an amplifier and a power supply unit according to this invention. The power supply unit encircled by the one-dot chain $l_2$ is roughly similar to the conventional power supply unit shown in FIG. 2. However, the former is different from the latter in that a switch operating section 11 is connected between the choke coil $L_{10}$ and the secondary coil $L_9$. Diodes $D_1$ and $D_3$ opposite in polarity are parallel-connected between the terminals $t_5$ and $t_6$ of the switch operating section 11 as shown in FIG. 4. More specifically, a control switch $SW_1$ is connected between the terminal $t_6$ and the diode $D_3$, so as to control the power adapted to control the connecting and disconnecting operation of the trap circuit. When the switch $SW_1$ is turned on, the voltage having one polarity of the commercial power supply inputted is outputted through the diode $D_3$ by the power supply unit 3. In contrast when the switch $SW_1$ is turned off, no output of this polarity is provided. This voltage is applied to the amplifier 2, and it is employed for connecting and disconnecting the trap circuit. The other diode $D_1$ is provided for supplying an operating power to the amplifier 2. The diode $D_1$ allows the voltage having the opposite polarity to pass therethrough to the amplifier 2.

The amplifier 2 is surrounded by the one-dot chain line $l_1$ in FIG. 3. Instead of the slide switch $SW_0$ and the FM trap circuit 6 in FIG. 2, an FM trap circuit 10 with a switching connection control section is connected between the terminal $t_1$ and the amplifier section 5. Furthermore, a diode $D_4$ having its polarity as shown and a DC power supply section 8 are connected between the connection point $P_3$ of the choke coil $L_{11}$ and the diode $D_2$ and ground. A switching means 9 is provided at the output side of the DC power supply section 8. If a relay is employed as the switching means 9, the DC power supply section 8 may be eliminated.

Figure 5A:
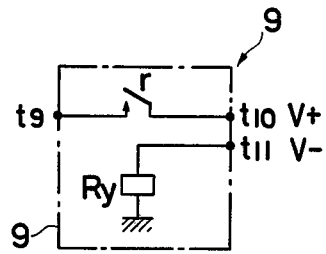
FIG. 5(a) is a circuit diagram showing a switching means in which a relay is employed.
Figure 5B:
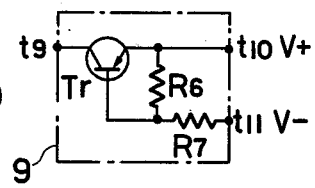
FIG. 5(b) is a circuit diagram showing a switching means in which a switching transistor is employed.

The circuit of the switching means 9 is shown in FIG. 5. FIG. 5(a) shows the case where a relay is employed. A relay contact means r is connected between an input terminal $t_{10}$ and the output terminal $t_9$, and a relay coil Ry is connected between another input terminal $t_{11}$ and ground. On the other hand, FIG. 5(b) shows the case where a switching transistor Tr is employed. The emitter of the transistor Tr is connected to the input terminal $t_{10}$, and the base is connected through a resistor $R_7$ to the other input terminal $t_{11}$. A resistor $R_6$ is connected between the emitter and the base of the transistor Tr. The operations of these switching means are similar to each other. In other words, when a positive voltage $V+$ and a negative voltage $V-$ are applied to the input terminals $t_{10}$ and $t_{11}$, respectively, the relay Ry is energized to close its contact means r, while the transistor Tr is rendered conductive. As a result, in both cases, the voltage $V+$ at the terminal $t_{10}$ is applied to the terminal $t_9$.

Figure 6:
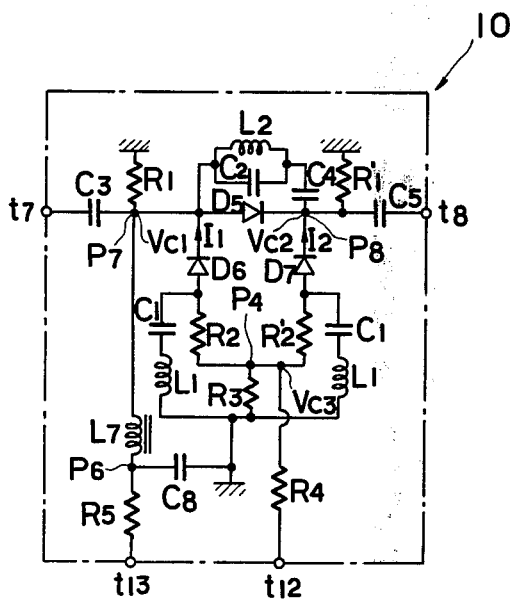
FIG. 6 is a circuit diagram showing an FM trap circuit with a switching connection control section.

FIG. 6 shows the arrangement of an FM trap circuit 10 with a switching connection control section. Reference numerals $t_7$ and $t_8$ designate a TV signal input terminal and a TV signal output terminal, respectively. Connected between these terminals are a capacitor $C_3$, a pin diode $D_5$ with its polarity as indicated, and a capacitor $C_5$. The pin diode $D_5$ is shunted by a series circuit of a capacitor $C_4$ and a parallel circuit formed with a coil $L_2$ and a capacitor $C_2$. The pin diode $D_5$ is further shunted by a series circuit of pin diodes $D_6$ and $D_7$ with their polarities as indicated and resistors $R_2$ and $R_2'$. A resistor $R_3$ is connected between ground and the connection point $P_4$ of the resistors $R_2$ and $R_2'$. A series circuit of a capacitor $C_1$ and a coil $L_1$ is connected in parallel to the resistors $R_2$ and $R_3$. Similarly, a series circuit of a capacitor $C_1$ and a coil $L_1$ is connected in parallel to the resistors $R_2'$ and $R_3$. Connected between the connection point $P_4$ and a control power supply input terminal $t_{12}$ is a resistor $R_4$. A series circuit of a resistor $R_5$ and a choke coil $L_7$ is connected between the input terminal $t_{13}$ and the connection point $P_7$ between the capacitor $C_3$ and the pin diode $D_5$. A resistor $R_1$ is connected between the connection point $P_7$ and ground. A capacitor $C_8$ is connected between the connection point $P_6$ of the resistor $R_5$ and the choke coil $L_7$ and ground. A resistor $R_1'$, is connected between ground and the connection point $P_8$ of the pin diode $D_5$ and the capacitor $C_5$.

Figure 7:
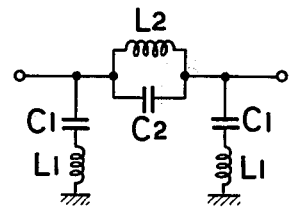
FIG. 7 shows an equivalent circuit of the FM trap circuit.

The operation of the FM trap circuit thus organized will now be described. When the control switch $SW_1$ of the power supply unit 3 is opened, no power is supplied to the D.C. power supply section 8 through the diode $D_3$, the choke coil $L_{10}$, the transmission line CX, the choke coil $L_{11}$ of the amplifier 2, and the diode $D_4$. Therefore, no negative voltage $V-$ is outputted by the D.C. power supply section 8, the relay Ry or the transistor Tr of the switching means 9 is inoperable, and no positive voltage $V+$ is applied to the terminal $t_9$. Accordingly, no voltage is applied to the terminal $t_{13}$ of the FM trap circuit 10, and the voltage $V+$ from the power supply section 7 is applied to the terminal $t_{12}$ only. Under this condition, a current $I_1$ flows in the path of $t_{12} \rightarrow R_4 \rightarrow R_2 \rightarrow$ pin diode $D_6 \rightarrow R_1 \rightarrow$ earth, while a current $I_2$ flows in the path of $t_{12} \rightarrow R_4 \rightarrow R_2' \rightarrow$ pin diode $D_7 \rightarrow R_1' \rightarrow$ earth. Accordingly, the pin diodes $D_6$ and $D_7$ are rendered conductive. In this circuit, $R_1 = R_1'$ and $R_2 = R_2'$, and $D_6R = D_7R$ (where $D_6R$ and $D_7R$ are the resistances of the pin diodes $D_6$ and $D_7$, respectively), and therefore $I_1 = I_2$. As a result, the potential $V_{c1} = R_1I_1$ at the connection point $P_7$ is equal to the potential $V_{c2} = R_1'I_2$ at the connection point $P_8$. Therefore, the pin diode $D_5$ is rendered non-conductive (off), and the parallel circuits of the coil $L_2$ and the capacitor $C_2$ becomes effective. Accordingly, the circuit 10 is equivalent to the $\pi$-type FM trap circuit shown in FIG. 7, and the FM signal is eliminated.

When the control switch $SW_1$ of the power supply unit 3 is closed, a current flows in the path of $D_3 \rightarrow L_{10} \rightarrow CX \rightarrow L_{11} \rightarrow D_4 \rightarrow 8$, and the voltage $V-$ is outputted by the DC power supply section 8. Therefore, the relay Ry or the transistor Tr is placed in "on" state. As a result, the output voltage $V+$ of the DC power supply section 7 is applied to the terminal $t_{13}$ of the trap circuit also. If, under this condition, the resistances are so determined as to satisfy the following relation, $R_1/R_5 \geqq R_3/R_4$, the potential Vc1 at the connection point $P_7$ is higher than the potential Vc3 (Vc1>Vc3), and the pin diode $D_6$ is rendered non-conductive (off) while the pin diodes $D_5$ and $D_7$ are rendered conductive (on) and non-conductive (off), respectively. Accordingly, the circuit ($L_2$ and $C_2$) is shorted and therefore a pair of circuits ($C_1$ and $L_1$) are interrupted. As a result, the FM trap circuit is separated.

As was described before, heretofore if the switch provided for the amplifier is operated to connect the FM trap circuit, the troublesome operation of someone climbing up on the roof to operate the switch must be carried out before an FM signal is received. However, according to this invention, it is possible to freely connect and disconnect the FM trap circuit by a person inside the building, without special control lines and devices, merely be adding a simple circuit to the conventional amplifier and power supply unit. At ordinary times, the FM trap circuit is connected to prevent the TV picture from bad influences, and when necessary the FM trap circuit is disconnected to receive an FM wave. Thus, the device according to this invention is very convenient.

If a relay is employed for connecting and disconnecting the trap circuit in the amplifier, the size of the amplifier casing is increased and accordingly it occupies a larger space. However, if a contactless semiconductor element such as a pin diode is employed as in this invention, since it is so small, the casing can be miniaturized, which leads to a reduction in manufacturing cost.

In the conventional method, the slide switch for connecting and disconnecting the trap circuit is necessarily protruded from the casing for operation; however, this is undesirable with respect to water-proofing. On the other hand, in the present invention, the trap circuit is connected or disconnected by remote control, and therefore the water-proofing of the casing can be made perfect. Thus, the present invention has a variety of advantages.

It goes without saying that the present invention is not limited to the FM trap circuit, and it may be applied to a trap circuit for preventing the interference of an adjacent channel. A concrete embodiment of the trap circuit 10' for preventing the interference of an adjacent channel is shown in FIG. 9 in which terminals identical to those shown in FIGS. 3 and 6 are designated by the same reference character. Furthermore, reference numerals I and II designate a band-pass filter and a band-rejection filter, respectively. Assuming that a channel A-2 having a band width of 54 to 60 MHz, a channel A-3 having a band width of 60 to 66 MHz and a channel A-4 having a band width of 66 to 72 MHz are provided, the band-pass filter I is operated so as to pass the channel A-3 signal and the band-rejection filter II is operated so as to block the channel A-3 signal, in accordance with the switching operation of the control switch $SW_1$. Accordingly, for example, when it is intended to receive the channel A-2 signal or the channel A-4 signal, the channel A-3 signal is blocked by the band-rejection filter II, as a result of which it is possible to prevent the interference of the channel A-3 signal.

In addition, assuming that three channels A-7, A-8 and A-9 having successive frequency bands further exist, a band-pass filter for the channel A-8 signal is further provided in such a manner that it is connected in parallel to the band-pass filter for the channel A-3 and a band-rejection filter for the channel A-8 signal is further provided in such a manner that it is connected in series to the band-rejection filter for the channel A-3.

The operation of the circuit of FIG. 9 will be obvious to one of ordinary skill in the art and need not be explained in detail. It is sufficient to not that, when a potential is applied only to terminal $t_{12}$, the diode $D_9$ will be forward biased and conducting while the diode $D_8$ will be reverse biased and non-conducting. Thus, the signal will be routed through the rejection filter II. On the other hand, when a potential is applied also to terminal $t_{13}$, the diode $D_8$ will become conductive while the diode $D_9$ becomes non-conductive and the signal will be routed through the band pass filter I. In this case, a zener diode is preselected so that zener voltage thereacross is equal to a half of voltage applied to the terminal $t_{12}$. It will be obvious to one of ordinary skill in the art that various changes could be made to the circuits illustrated without departing from the spirit of the invention. For example, the diodes $D_5$, $D_6$ and $D_7$ have been described as pin diodes but conventional switching diodes could be used as well. Furthermore, although the negative half cycle of the A.C. signal has been shown as the trap circuit control signal, the polarities could easily be reversed so that the negative half cycle is the amplifier power signal and the positive half cycle is the trap circuit control signal. Also the trap circuit could be enabled by the presence of the second half cycle rather than the absence.

What is claimed is:

1. A remote control device for a trap circuit in an amplifier which is inserted in a signal transmission line in the vicinity of a television community receiving system antenna and is energized through said signal transmission line by a power supply unit in a subscriber's house, comprising:

a first diode in said power supply unit for supplying a first half cycle of an A.C. power supply signal to said amplifier;

a second diode in said power supply unit for supplying the second half cycle of said A.C. power supply signal to said amplifier when connected to said A.C. signal;

a switch in the subscriber's home for connecting and disconnecting said second diode from said A.C. power signal;

a D.C. power supply section in said amplifier which receives the first half cycle from said first diode and supplies said first half signal as an amplifier power signal to an amplifier section; and a trap circuit switch means in said amplifier which is controlled by the presence and absence of said second half cycle from said second diode to enable and disable said trap circuit.

2. A remote control device according to claim 1, wherein said trap circuit switch means disables said trap circuit in response to the presence of said second half cycle.

3. A remote control device according to claim 1, wherein said first half cycle is a positive half cycle and said second half cycle is a negative half cycle.

4. A remote control device according to claims 1, 2, or 3, wherein said trap circuit is an FM trap circuit.

5. A remote control device according to claims 1, 2 or 3, wherein said trap circuit is an adjacent channel trap circuit.

6. A remote control device according to claim 4, wherein said trap circuit switch means comprises;
   a first diode connected in parallel with said trap circuit;
   a second diode connected between the anode of said first diode and said D.C. power supply section;
   a third diode connected between the cathode of said first diode and said D.C. power supply section;
   switching signal generating means for generating a switching signal in response to the presence or absence of said second half cycle; and
   means for applying a D.C. signal to one side of said first diode in response to said switching signal so that in the absence of said switching signal the first diode is non-conducting and said trap circuit is enabled and in the presence of said switching signal said first diode is conducting and said trap circuit is disabled.

7. A remote control device according to claim 5, wherein said trap circuit switch means comprises:
   a band rejection filter;
   a band pass filter;
   a first diode connected in series with said band pass filter;
   a second diode connected in series with said band rejection filter, said first and second diodes being connected to said D.C. power supply source for receiving a first bias potential;
   switching signal generating means for generating a switching signal in response to the presence or absence of said second half cycle; and
   means for supplying a second bias potential to said first and second diodes in response to said switching signal said first and second diodes are non-conducting and conducting, respectively, when only said first bias signal is received but conducting and non-conducting, respectively, when said second bias signal is received.

8. A remote control device according to claim 6, wherein said diodes are pin diodes.

9. A remote control device according to claim 7, wherein said diodes are pin diodes.

10. A remote control device according to claim 6, wherein said diodes are switching diodes.

11. A remote control device according to claim 7, wherein said diodes are switching diodes.

* * * * *